United States Patent
Holmes et al.

(10) Patent No.: US 11,164,992 B2
(45) Date of Patent: Nov. 2, 2021

(54) DEVICE WITH INTEGRATION OF LIGHT-EMITTING DIODE, LIGHT SENSOR, AND BIO-ELECTRODE SENSORS ON A SUBSTRATE

(71) Applicant: International Business Machines Corporation, Armonk, NY (US)

(72) Inventors: Steve Holmes, Ossining, NY (US); Devendra Sadana, Pleasantville, NY (US); Stephen W. Bedell, Wappingers Falls, NY (US); Bruce Doris, Slingerlands, NY (US); Hariklia Deligianni, Alpine, NJ (US); Jia Chen, New York, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 145 days.

(21) Appl. No.: 16/681,974

(22) Filed: Nov. 13, 2019

(65) Prior Publication Data
US 2020/0083398 A1 Mar. 12, 2020

Related U.S. Application Data

(62) Division of application No. 16/050,989, filed on Jul. 31, 2018, now Pat. No. 10,566,493.

(51) Int. Cl.
| | | |
|---|---|---|
| *H01L 33/00* | (2010.01) | |
| *H01L 33/40* | (2010.01) | |
| *H01L 33/32* | (2010.01) | |
| *H01L 27/15* | (2006.01) | |
| *H01L 33/62* | (2010.01) | |

(52) U.S. Cl.
CPC ........ *H01L 33/0075* (2013.01); *H01L 27/156* (2013.01); *H01L 33/32* (2013.01); *H01L 33/40* (2013.01); *H01L 33/62* (2013.01)

(58) Field of Classification Search
None
See application file for complete search history.

(56) References Cited

U.S. PATENT DOCUMENTS

2007/0029558 A1* 2/2007 Nishizono ............. H01L 21/326
257/96

OTHER PUBLICATIONS

List of all IBM Related Dockets, Appendix P, 2019.

* cited by examiner

*Primary Examiner* — Michelle Mandala
(74) *Attorney, Agent, or Firm* — Garg Law Firm, PLLC; Rakesh Garg; Jeffrey S LaBaw

(57) ABSTRACT

A semiconductor device includes a substrate and a buffer layer disposed on a first portion, a second portion, and a third portion of the substrate. The semiconductor device further includes a multilayer light-emitting diode (LED) stack disposed on the first portion of the substrate, and an optical sensor disposed on the second portion of the substrate. The semiconductor device further includes at least one electrode disposed on the third portion of the substrate, a first conductor in contact with the multilayer LED stack, and a second conductor in contact with the optical sensor. The at least one electrode, the first conductor, and the second conductor are formed of a glassy carbon material.

14 Claims, 22 Drawing Sheets

FIGURE 3
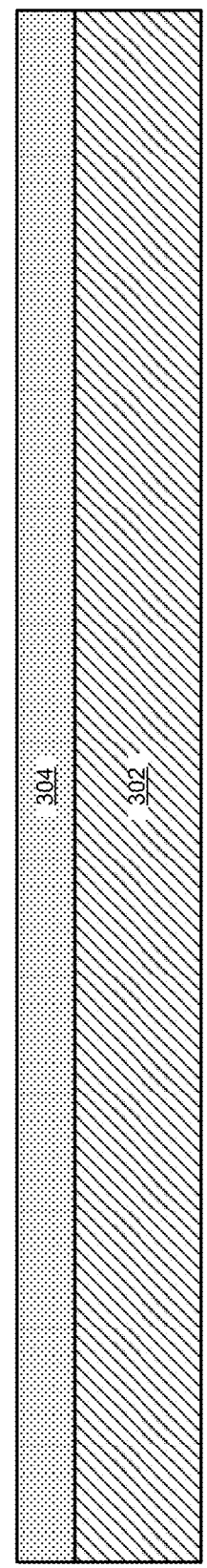

DEVICE WITH INTEGRATION OF LIGHT-EMITTING DIODE, LIGHT SENSOR, AND BIO-ELECTRODE SENSORS ON A SUBSTRATE

TECHNICAL FIELD

The present invention relates generally to a method for fabricating a device including a light-emitting diode, light sensor, and bio-electrode sensors and a structure formed by the method. More particularly, the present invention relates to a method for fabricating a device with integration of a light-emitting diode, a light sensor, and bio-electrode sensors on a substrate and a structure formed by the method.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

Many semiconductor devices are planar, i.e., where the semiconductor structures are fabricated on one plane. A non-planar device is a three-dimensional (3D) device where some of the structures are formed above or below a given plane of fabrication.

SUMMARY

The illustrative embodiments provide a method and apparatus. An embodiment of a method of fabricating a semiconductor device includes receiving a substrate, forming a buffer layer on the substrate, and forming a multilayer light-emitting diode (LED) stack on the buffer layer. The embodiment further includes etching a portion of the multilayer LED stack to form an optical sensor region trench, forming a dielectric inner spacer on at least one side of the optical sensor region trench, and growing an optical sensor epitaxy in the optical sensor region trench to form an optical sensor in contact with the dielectric inner spacer. The embodiment further includes depositing a contact material on the multilayer LED stack and the dielectric inner spacer, and etching portions of the multilayer LED stack to form an optical sensor conductor region, an LED conductor region, and a glassy carbon electrode conductor region. The embodiment further includes depositing a glassy carbon material in the optical sensor conductor region, the LED conductor region, and the glassy carbon electrode conductor region. The embodiment further includes etching the glassy carbon material to form an optical sensor conductor, a multilayer LED stack conductor and glassy carbon electrodes disposed on a portion of the buffer layer.

An embodiment further includes depositing a dielectric capping layer on the multilayer LED stack. An embodiment further includes applying a first photoresist layer to portions of dielectric capping layer, patterning the optical sensor using a lithographic patterning process, and removing the first photoresist layer.

In an embodiment, forming the dielectric inner spacer on at least one side of the optical sensor region trench further includes: depositing an optical sensor dielectric layer on the optical sensor region trench, and etching away portions of the optical sensor dielectric layer to form the dielectric inner spacer.

An embodiment further includes applying a second photoresist layer to the contact material, patterning the optical sensor conductor region, the LED conductor region, and the glassy carbon electrode conductor region, and removing the second photoresist layer.

An embodiment further includes applying a third photoresist layer to the optical sensor region and the multilayer LED stack region, patterning portions of the buffer layer, and removing the third photoresist layer.

An embodiment further includes depositing a spacer dielectric on portions of the substrate, the buffer layer, the optical sensor, the multilayer LED stack, and the contact material, and etching the spacer dielectric to form at least one dielectric outer spacer proximate to one or more remaining portions of the buffer layer, portions of the optical sensor, and the multilayer LED stack.

An embodiment further includes depositing a hard mask material on the glassy carbon material. In an embodiment, the hard mask material is a titanium (Ti) material.

An embodiment further includes applying a fourth photoresist layer to portions of the hard mask material, patterning the glassy carbon conductor region, and removing the fourth photoresist layer.

In an embodiment, the substrate is a sapphire substrate. In an embodiment, the buffer layer is formed of a zirconium diboride (ZrB2) material. In an embodiment, the multilayer LED stack is a gallium nitride (GaN) multilayer LED stack. In an embodiment, the optical sensor is a gallium nitride (GaN) optical sensor.

An embodiment of a semiconductor device includes a substrate, and a buffer layer disposed on a first portion, a second portion, and a third portion of the substrate. The embodiment further includes a multilayer light-emitting diode (LED) stack disposed on the first portion of the substrate, and an optical sensor disposed on the second portion of the substrate. The embodiment further includes at least one electrode disposed on the third portion of the substrate, a first conductor in contact with the multilayer LED stack, and a second conductor in contact with the optical sensor. In the embodiment, the at least one electrode, the first conductor, and the second conductor are formed of a glassy carbon material.

In an embodiment, the substrate is a sapphire substrate. In an embodiment, the buffer layer is formed of a zirconium diboride (ZrB2) material. In an embodiment, the multilayer LED stack is a gallium nitride (GaN) multilayer LED stack. In an embodiment, the optical sensor is a gallium nitride (GaN) optical sensor.

An embodiment of an apparatus includes a substrate, a zirconium diboride (ZrB2) layer disposed on a portion of the substrate, and a gallium nitride (GaN) optical sensor stack disposed on a portion of the ZrB2 layer.

In an embodiment, the substrate is a sapphire substrate. Another embodiment further includes a conductor in contact with a portion of the GaN optical sensor stack. In the embodiment, the conductor is formed of a glassy carbon material.

An embodiment includes a computer usable program product. The computer usable program product includes one or more computer-readable storage devices, and program instructions stored on at least one of the one or more storage devices.

In an embodiment, the computer usable code is stored in a computer readable storage device in a data processing system, and wherein the computer usable code is transferred over a network from a remote data processing system.

In an embodiment, the computer usable code is stored in a computer readable storage device in a server data processing system, and wherein the computer usable code is downloaded over a network to a remote data processing system for use in a computer readable storage device associated with the remote data processing system.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 3 depicts a cross-section view of a portion of a process for fabricating a semiconductor device having a light-emitting diode, a light sensor, and bio-electrode sensors according to an illustrative embodiment;

DETAILED DESCRIPTION

Figure 1:
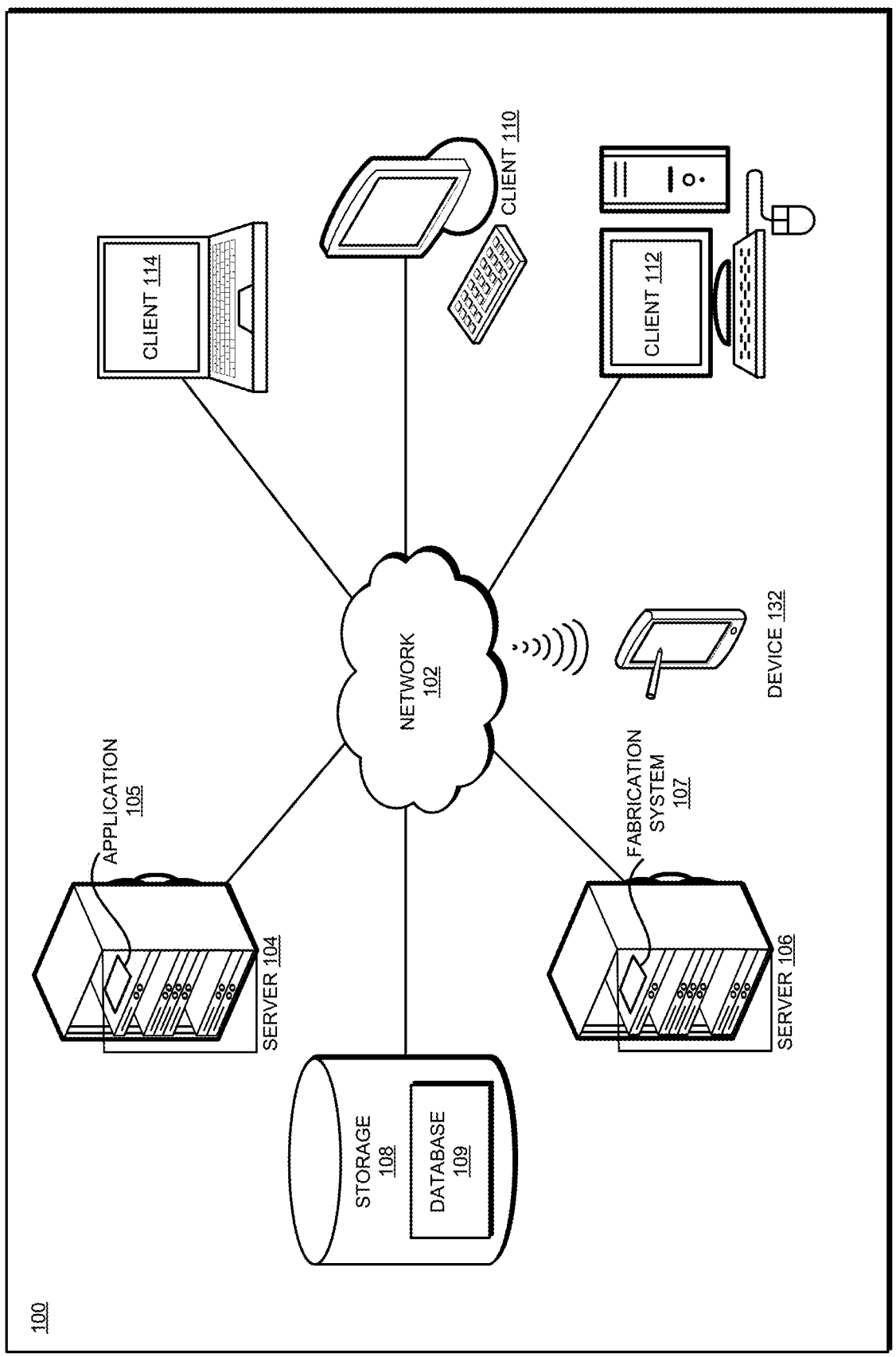
FIG. 1 depicts a block diagram of a network of data processing systems in which illustrative embodiments may be implemented.

The illustrative embodiments relate to a method for fabricating a semiconductor device with integration of a light-emitting diode, a light sensor, and bio-electrode sensors on a substrate and a structure formed by the method. Optogenetics is a biological technique which involves the use of light to control cells in living tissue, typically neurons, that have been genetically modified to express light-sensitive ion channels. Optic and genetic techniques are used to control and monitor the activities of individual neurons in living tissue and to measure the effects of the control in real-time. Light-sensitive proteins are used as reagents and neuronal control is achieved using optogenetic actuators such as channelrhodopsin, halorhodopsin, and archaerhodopsin. Optical recording of neuronal activities can be made with the help of optogenetic sensors for detecting the presence of chemicals, compounds and/or other indicators indicative of particular neural activity such as calcium, vesicular release (synapto-pHluorin), neurotransmitter (GluSnFRs, dopamine, serotonin, acetylcholine and others), or membrane voltage.

The illustrative embodiments recognize that there is a need for a nanoscale, low power semiconductor device, such as optogenetic device, with a low power light-emitting diode (LED), a light sensor, and bio-electrode sensors incorporated into a single device. In various embodiments, an optogenetic device as described with respect to one or more embodiments may be used for diagnosis and/or treatment of neural disorders such as epilepsy, depression, schizophrenia, addition, and pain. A particular embodiment provides for a semiconductor device with integration of a light-emitting diode configured to provide optical stimulation of opsin-doped neurons with blue light or other visible light, a visible light sensor configured to detect calcium ions ($Ca^{2+}$) by fluorescence, and glassy carbon electrodes configured to detect dopamine by fast scan cyclic voltammetry on a sapphire substrate ($Al_2O_3$). In one or more embodiments, the light-emitting diode, the light sensor, and the bio-electrode sensors are fabricated using materials that are compatible with a biological environment, such as a body, as well as compatible with processing needs of other integrated devices. In particular embodiments, the light-emitting diode and the light sensor are fabricated using a gallium nitride (GaN) material, and the bio-electrode sensors are fabricated using a glassy carbon material. In one or more embodiments, glassy carbon is a non-graphitizing, or non-graphitizable, carbon which combines glassy and ceramic properties with those of graphite.

An embodiment of a process for fabricating a semiconductor device includes depositing a zirconium diboride (ZrB2) epitaxial layer on a sapphire substrate ($Al_2O_3$) as a buffer layer for GaN epitaxy, and depositing a GaN epitaxy stack for a blue LED device on the ZrB2 layer. The embodiment further includes performing a second GaN epitaxy process to grow a stack for an optical sensor on the ZrB2 layer. The embodiment further includes forming glassy carbon contacts to the top of the LED and optical sensor regions, and fabricating glassy carbon electrodes on the ZrB2 layer. In a particular embodiment, the glassy carbon electrodes are fabricated in the same steps as the contacts to the LED and optical sensor devices. One or more embodiments recognize that GaN, ZrB2 and glassy carbon are very stable in biological environments and are inert to liquid etching.

One or more embodiments provide for a semiconductor structure incorporating a GaN LED device, an optical sensor device, and glassy carbon interconnects and conductors upon a substrate. In particular embodiments, the substrate is a sapphire substrate. In particular embodiments, the semiconductor structure includes ZrB2 or titanium diboride (TiB2) conductors. One or more embodiments provide for a monolithic semiconductor device structure with integral elements including an LED, optical sensor, and a glassy carbon electrode bound into a single device, without requiring the use of 3D binding techniques, built into a single substrate. One or more embodiments are directed to a method or process for fabricating such a monolithic semiconductor device structure as described herein.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate a semiconductor device with integration of a light-emitting diode, a light sensor, and bio-electrode sensors on a substrate.

For the clarity of the description, and without implying any limitation thereto, the illustrative embodiments are described using a semiconductor device with integration of a light-emitting diode, a light sensor, and bio-electrode sensors on a substrate. An embodiment can be implemented with different types and/or numbers of devices, a number of gates, and/or a different number of substrates within the scope of the illustrative embodiments.

Furthermore, simplified diagrams of the example semiconductor devices are used in the figures and the illustrative embodiments. In an actual fabrication of a semiconductor device, additional structures that are not shown or described herein may be present without departing the scope of the illustrative embodiments. Similarly, within the scope of the illustrative embodiments, a shown or described structure in the example semiconductor devices may be fabricated differently to yield a similar operation or result as described herein.

Differently shaded portions in the two-dimensional drawing of the example semiconductor devices are intended to represent different structures in the example semiconductor devices, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating semiconductor devices according to the illustrative embodiments.

Furthermore, the illustrative embodiments are described with respect to semiconductor devices only as an example. The steps described by the various illustrative embodiments can be adapted for fabricating other planar and non-planar devices in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating semiconductor devices. An embodiment provides a method for fabricating semiconductor devices.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
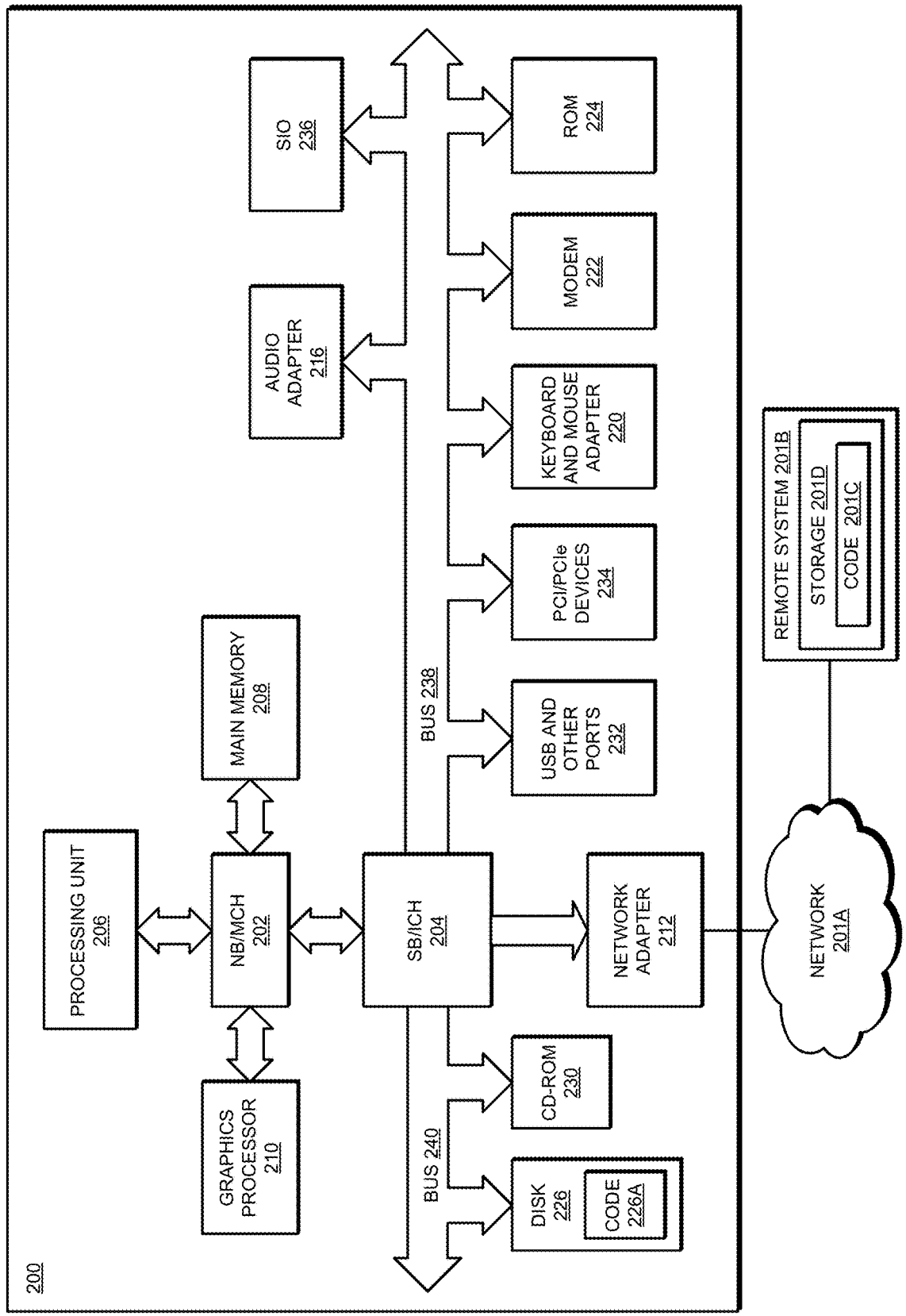
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating a semiconductor device with integration of a light-emitting diode, a light sensor, and bio-electrode sensors on a substrate in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

With reference to FIGS. 3-20, these figures depict portions of an example process for fabricating semiconductor device with integration of a light-emitting diode, a light sensor, and bio-electrode sensors on a substrate in accordance with one or more illustrative embodiments. In the particular embodiments illustrated in FIGS. 3-20, a single semiconductor device with integration of a light-emitting diode, a light sensor, and bio-electrode sensors is fabricated upon a substrate and/or wafer. It should be understood that in other embodiments, any combination of light-emitting diodes, light sensors, and bio-electrode sensors or other combinations of any numbers of semiconductor devices, may be fabricated on a substrate in a similar manner.

With reference to FIG. 3, this figure depicts a cross-section view of a portion of a process for fabricating a semiconductor device having a light-emitting diode, a light sensor, and bio-electrode sensors in which an example structure 300 is formed according to an illustrative embodiment. In the embodiment, fabrication system 107 receives structure 300 including a substrate 302. In one or more embodiments, substrate 302 is a sapphire ($Al_2O_3$) substrate. In the embodiment, fabrication system 107 grows a zirconium diboride (ZrB2) epitaxial layer 304 or another buffer layer on substrate 302. In at least one embodiment, fabrication system 107 grows ZrB2 layer 304 on substrate 302 using an epitaxial growth process.

Figure 4:
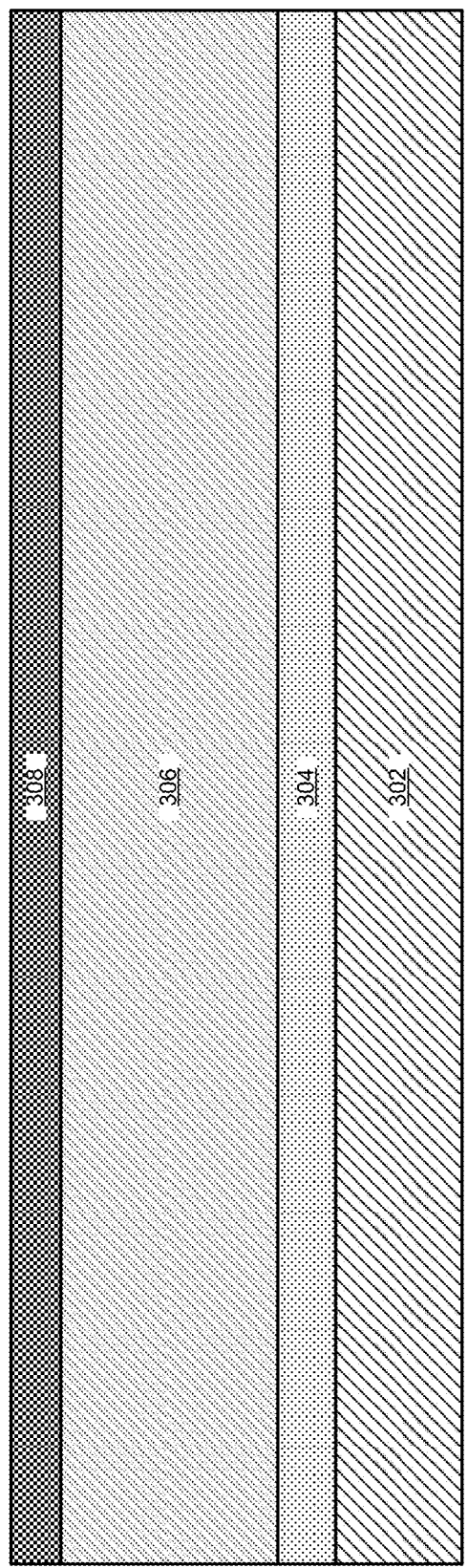
FIG. 4 depicts a cross-section view of another portion of the process according to an illustrative embodiment.

With reference to FIG. 4, FIG. 4 depicts a cross-section view of another portion of the process in which a structure 400 is formed according to an illustrative embodiment. In the embodiment, fabrication system 107 forms a multilayer LED stack 306 on ZrB2 layer 304. In one or more embodiments, fabrication system 107 forms each of a plurality of layers of the multilayer LED stack 306 using an epitaxial growth process. In one or more embodiments, multilayer LED stack 306 is a gallium nitride (GaN) multilayer LED stack. It should be understood that the GaN multilayer LED stack may be fabricated according to one or more well-known GaN LED stack fabrication processes. In particular embodiments, the GaN LED stack is fabricating to including a number of layers including a n-GaN layer, an n-AlGaN clad layer, an InGaN emission layer, a p-AlGaN clad layer, and a p-GaN layer such as described in U.S. Pat. No. 6,566,218, incorporated herein by reference.

In the embodiment, fabrication system 107 deposits a dielectric capping layer 308 on multilayer LED stack 306. In a particular embodiment, dielectric capping layer 308 is composed of a silicon dioxide (SiO2) or aluminum oxide ($Al_2O_3$) material.

Figure 5:
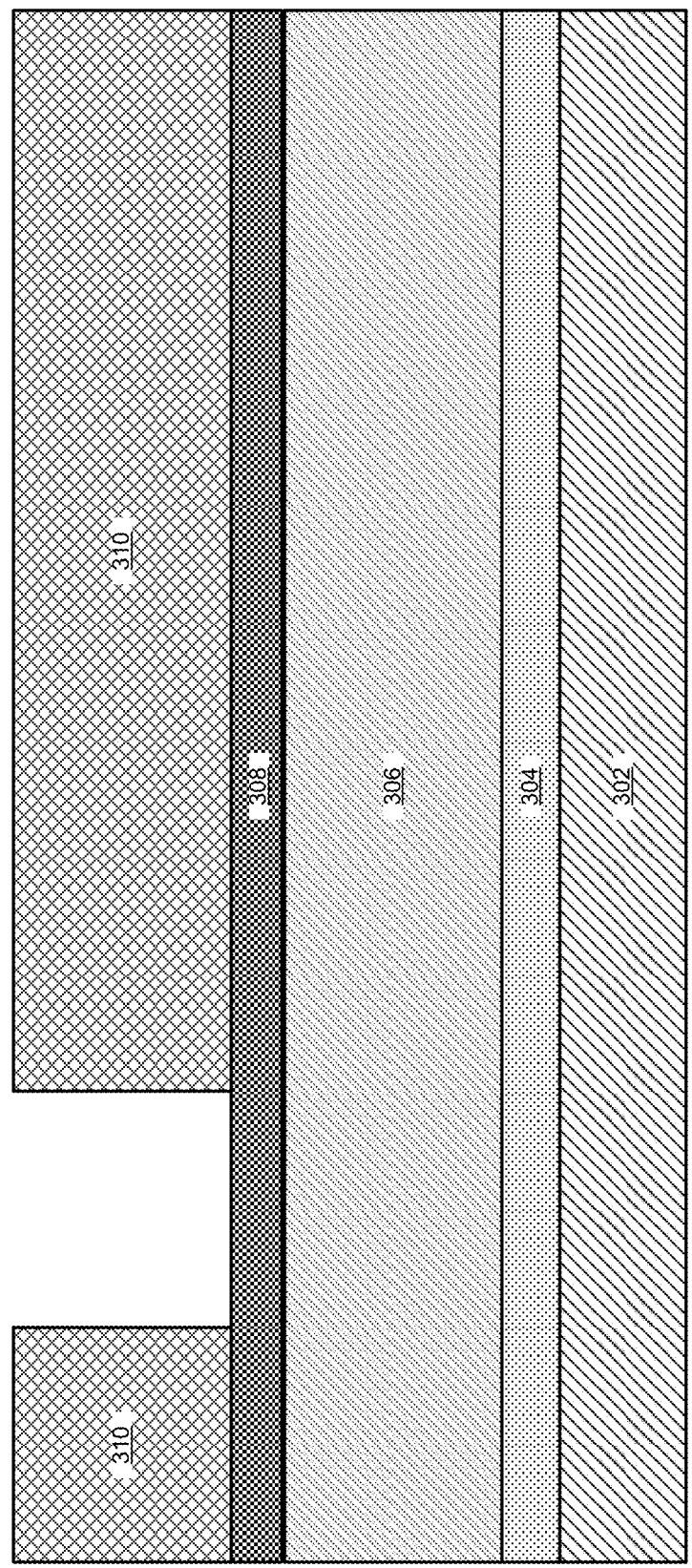
FIG. 5 depicts a cross-section view of another portion of the process according to an illustrative embodiment.

With reference to FIG. 5, FIG. 5 depicts a cross-section view of another portion of the process in which a structure 500 is formed according to an illustrative embodiment. In the embodiment, fabrication system 107 applies a first photoresist layer 310 to portions of dielectric capping layer 308 not including an optical sensor region of structure 500, and patterns the optical sensor region using a lithographic patterning process.

Figure 6:
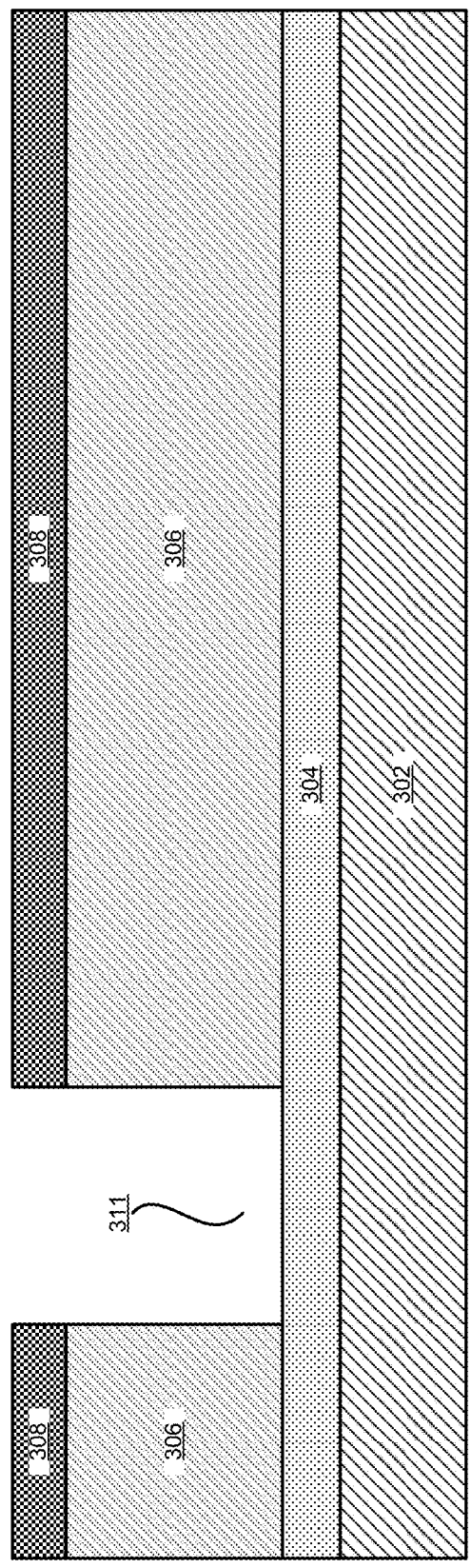
FIG. 6 depicts a cross-section view of another portion of the process according to an illustrative embodiment.

With reference to FIG. 6, FIG. 6 depicts a cross-section view of another portion of the process in which a structure 600 is formed according to an illustrative embodiment. In the embodiment, fabrication system 107 etches a portion of dielectric capping layer 308 and multilayer LED stack 306 down to a depth of ZrB2 layer 304 to form an optical sensor region trench 311. In a particular embodiment, fabrication system 107 etches the portion of dielectric capping layer 308 and multilayer LED stack 306 using a reactive-ion etching (RIE) process. In the embodiment fabrication system 107 further strips first photoresist layer 310.

Figure 7:
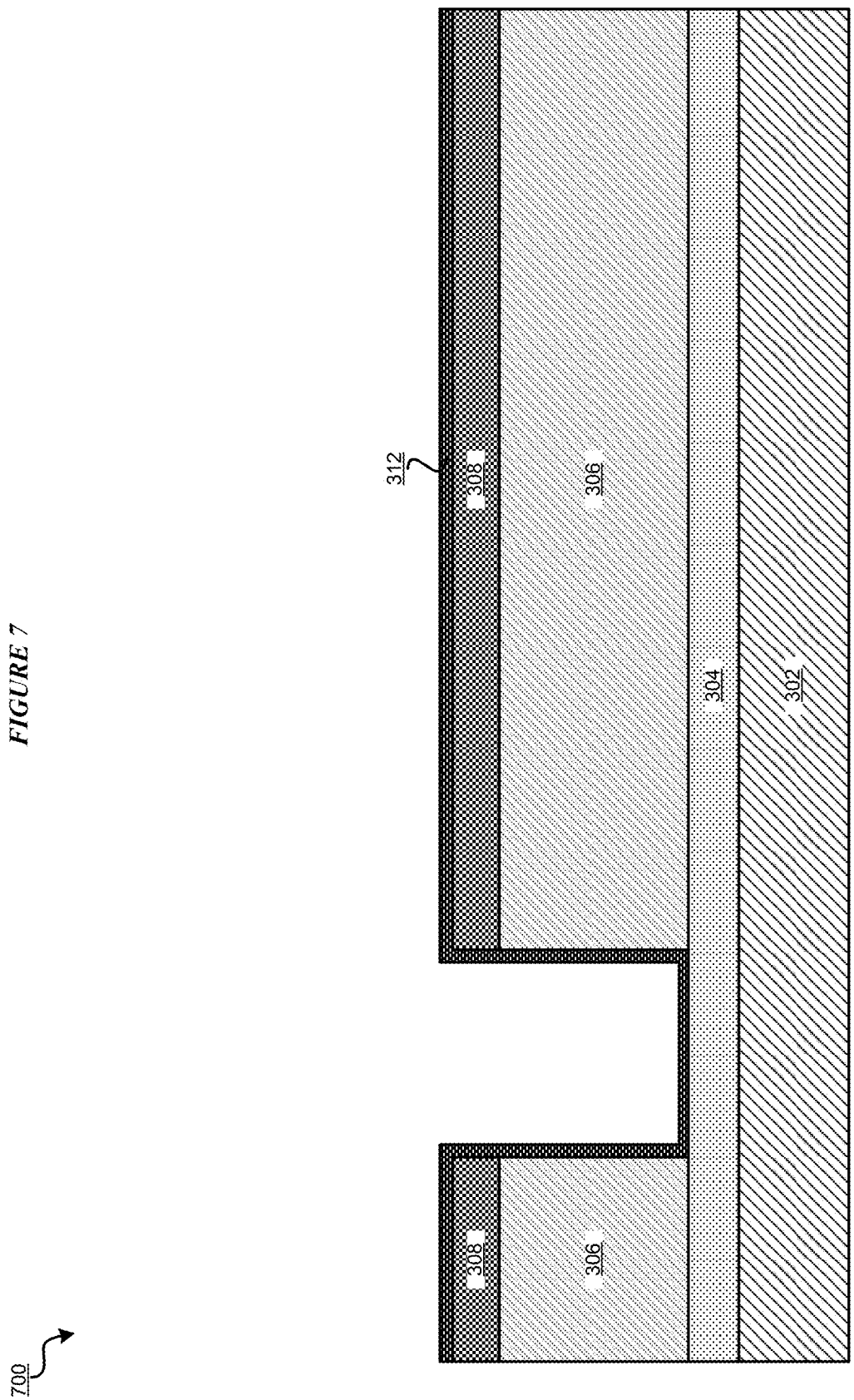
FIG. 7 depicts a cross-section view of another portion of the process according to an illustrative embodiment.

With reference to FIG. 7, FIG. 7 depicts a cross-section view of another portion of the process in which a structure 700 is formed according to an illustrative embodiment. In the embodiment, fabrication system 107 deposits an optical sensor dielectric layer 312 upon a top surface of dielectric capping layer 308 and the exposed surfaces of optical sensor region trench 311. In particular embodiments, optical sensor dielectric layer 312 is composed of one or more of an Al2O3 material, an SiO2 material, and a silicon nitride (Si3N4) material. In one or more embodiments, optical sensor dielectric layer 312 is deposited using a chemical vapor deposition (CVD) process followed by an annealing process.

Figure 8:
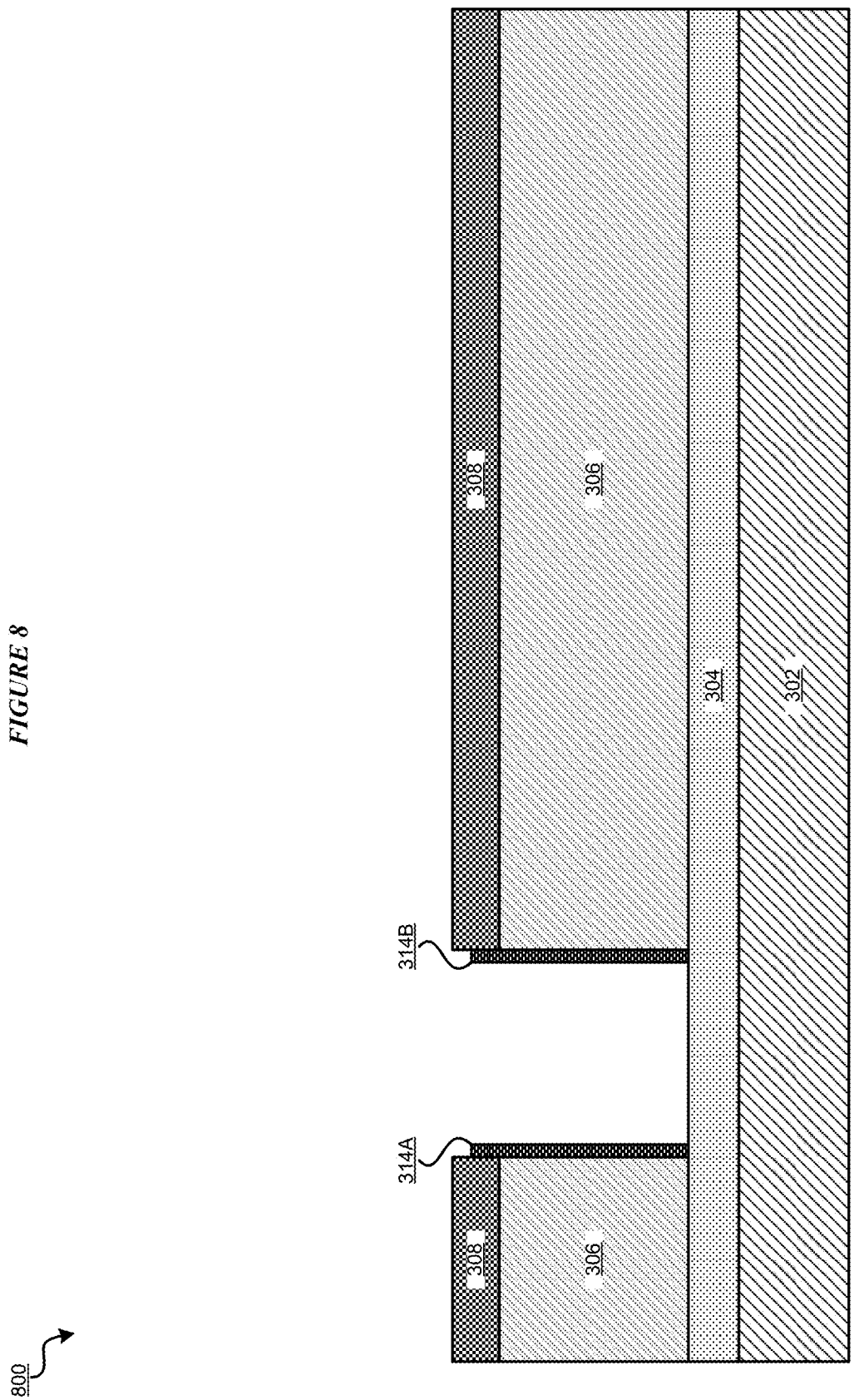
FIG. 8 depicts a cross-section view of another portion of the process according to an illustrative embodiment.

With reference to FIG. 8, FIG. 8 depicts a cross-section view of another portion of the process in which a structure 800 is formed according to an illustrative embodiment. In the embodiment, fabrication system 107 etches away portions of optical sensor dielectric layer 312 to form dielectric inner spacers 314A and 314B on sides of optical sensor region trench 311. In a particular embodiment, fabrication system 107 etches away the portions of optical sensor dielectric layer 312 using an RIE process.

Figure 9:
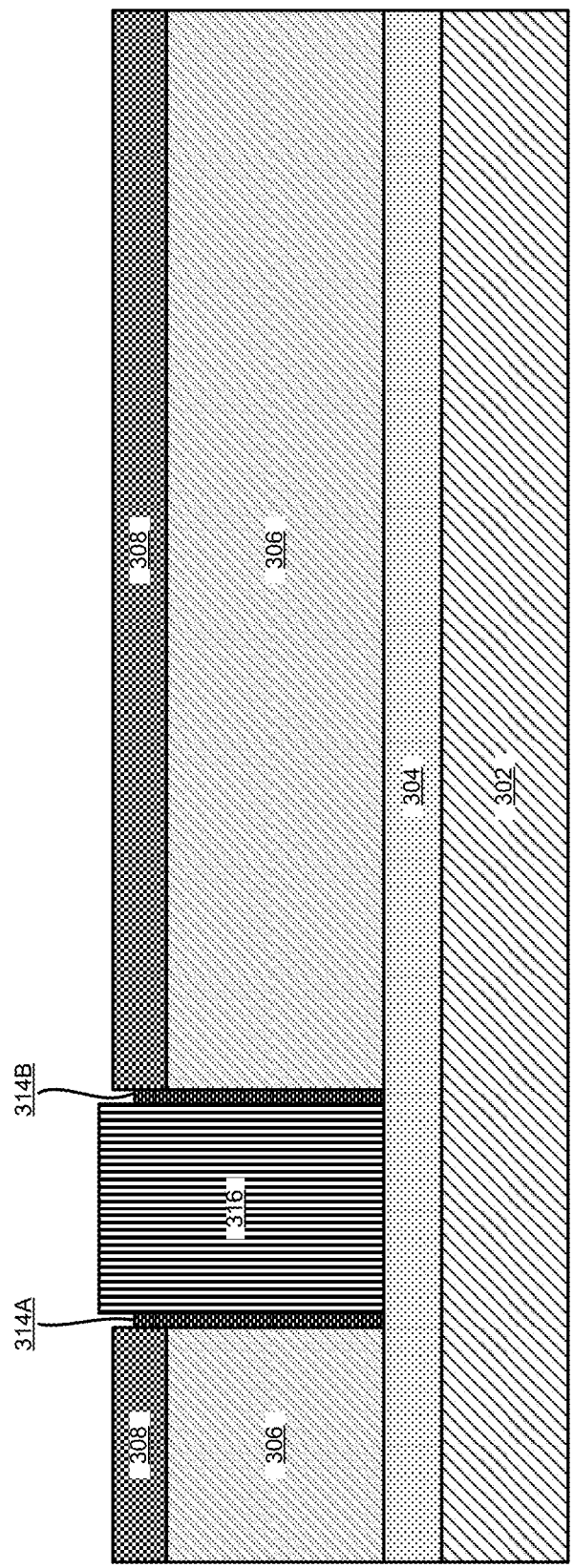
FIG. 9 depicts a cross-section view of another portion of the process according to an illustrative embodiment.

With reference to FIG. 9, FIG. 9 depicts a cross-section view of another portion of the process in which a structure 900 is formed according to an illustrative embodiment. In the embodiment, fabrication system 107 grows an optical sensor epitaxy in optical sensor region trench 311 to form an optical sensor 316 in contact with dielectric inner spacer 314A and 314B. In one or more embodiments, optical sensor 316 is a multilayer GaN optical sensor stack including an n-GaN layer, an i-GaN layer, and a p-GaN layer.

Figure 10:
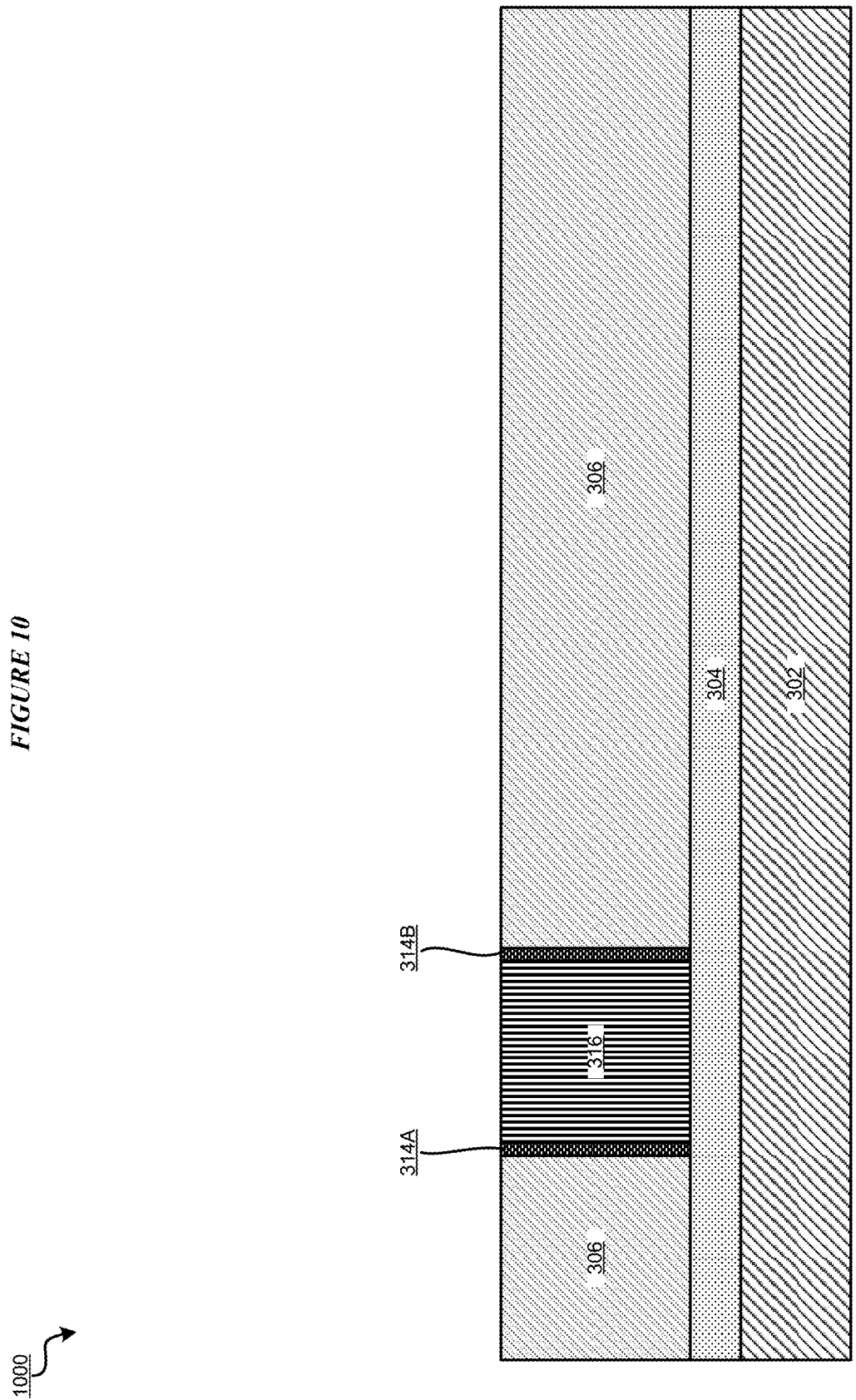
FIG. 10 depicts a cross-section view of another portion of the process according to an illustrative embodiment.

With reference to FIG. 10, FIG. 10 depicts a cross-section view of another portion of the process in which a structure 1000 is formed according to an illustrative embodiment. In the embodiment, fabrication system 107 removes dielectric capping layer 308 and planarizes multilayer LED stack 306 and dielectric inner spacers 314A and 314B. In a particular embodiment, fabrication system 107 removes dielectric capping layer 308 and planarizes multilayer LED stack 306 and dielectric inner spacers 314A and 314B using a chemical mechanical planarization (CMP) process.

Figure 11:
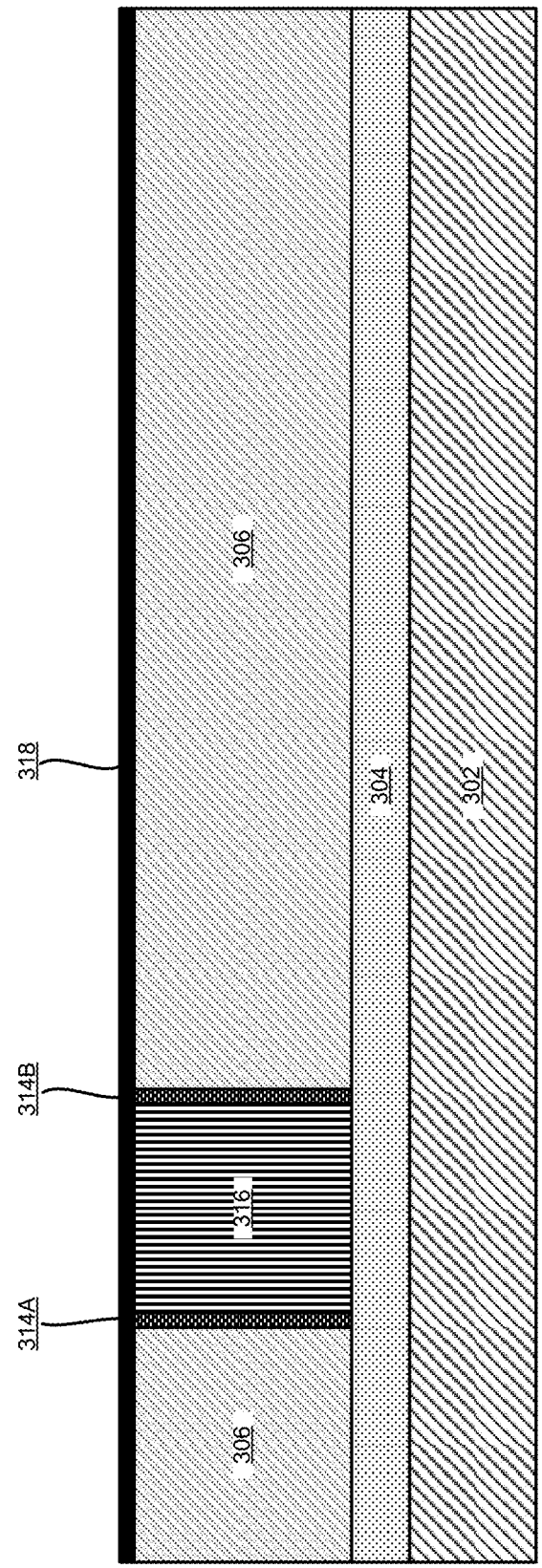
FIG. 11 depicts a cross-section view of another portion of the process according to an illustrative embodiment.

With reference to FIG. 11, FIG. 11 depicts a cross-section view of another portion of the process in which a structure 1100 is formed according to an illustrative embodiment. In the embodiment, fabrication system 107 deposits a contact material 318 for the GaN devices (i.e., the LED device and the light sensor device) on upper surfaces of multilayer LED stack 306 and dielectric inner spacers 314A and 314B. In a particular embodiment, contact material 318 is composed of a metal material such as a gold (Au) or nickel (Ni) material.

Figure 12:
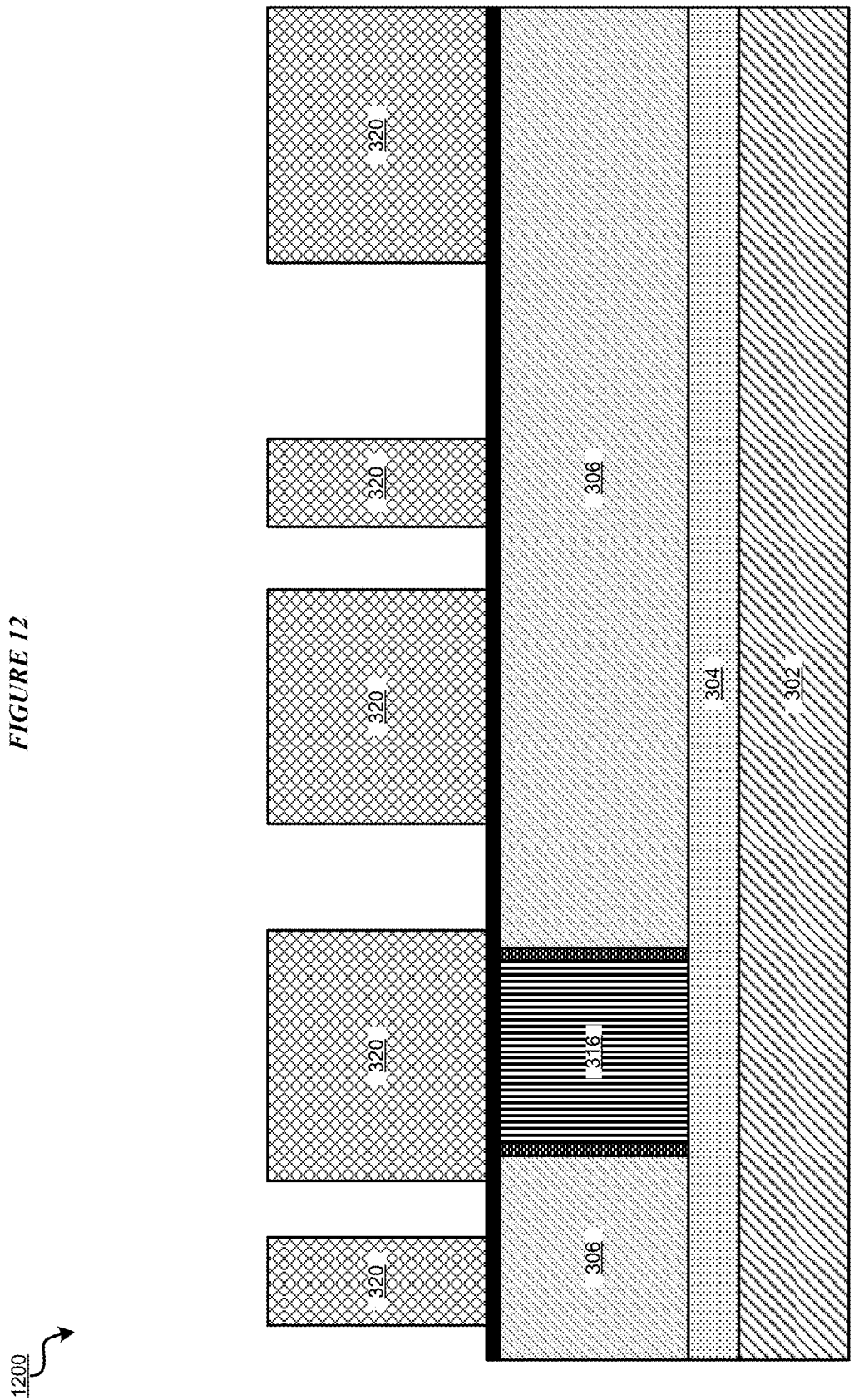
FIG. 12 depicts a cross-section view of another portion of the process according to an illustrative embodiment.

With reference to FIG. 12, FIG. 12 depicts a cross-section view of another portion of the process in which a structure 1200 is formed according to an illustrative embodiment. In the embodiment, fabrication system 107 applies a second photoresist layer 320 to contact material 318 and patterns the optical sensor, LED, and glassy carbon electrode regions using a lithographic patterning process.

Figure 13:
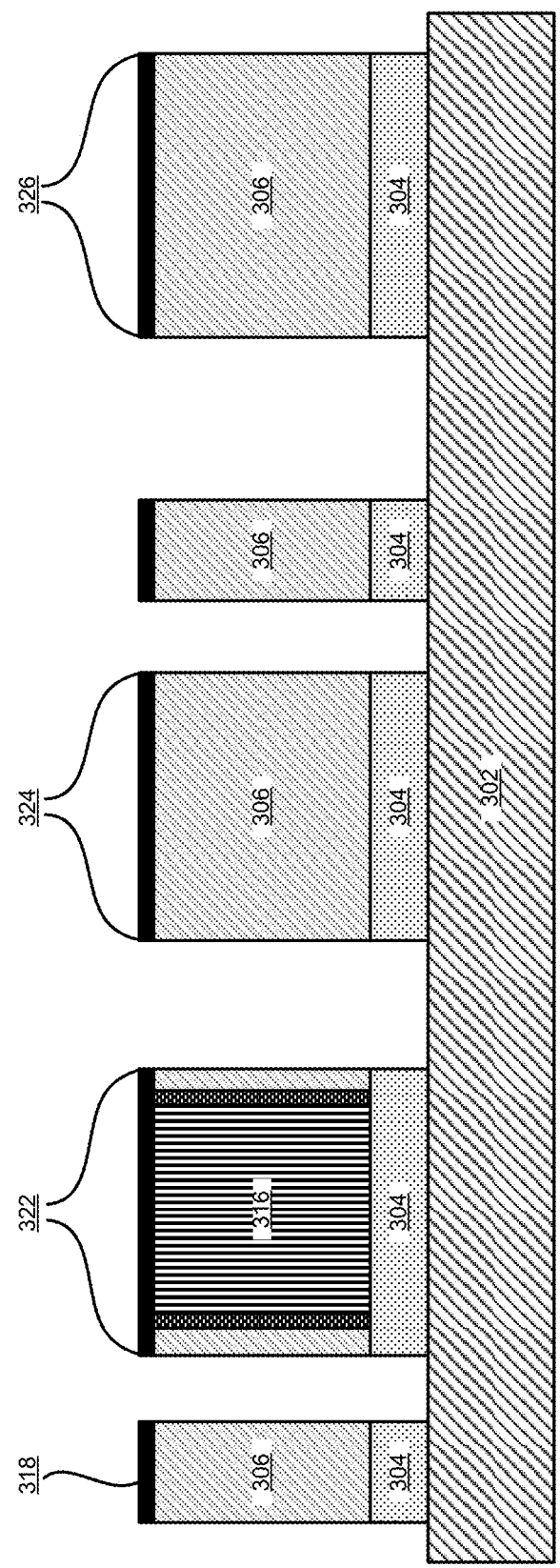
FIG. 13 depicts a cross-section view of another portion of the process according to an illustrative embodiment.

With reference to FIG. 13, FIG. 13 depicts a cross-section view of another portion of the process in which a structure 1300 is formed according to an illustrative embodiment. In the embodiment, fabrication system 107 etches portions of multilayer LED stack 306 to form optical sensor conductor region 322, LED region 324, and glassy carbon electrode conductor region 326 and strips second photoresist layer 320. In a particular embodiment, fabrication system 107 etches the portions of multilayer LED stack 306 using an RIE process.

Figure 14:
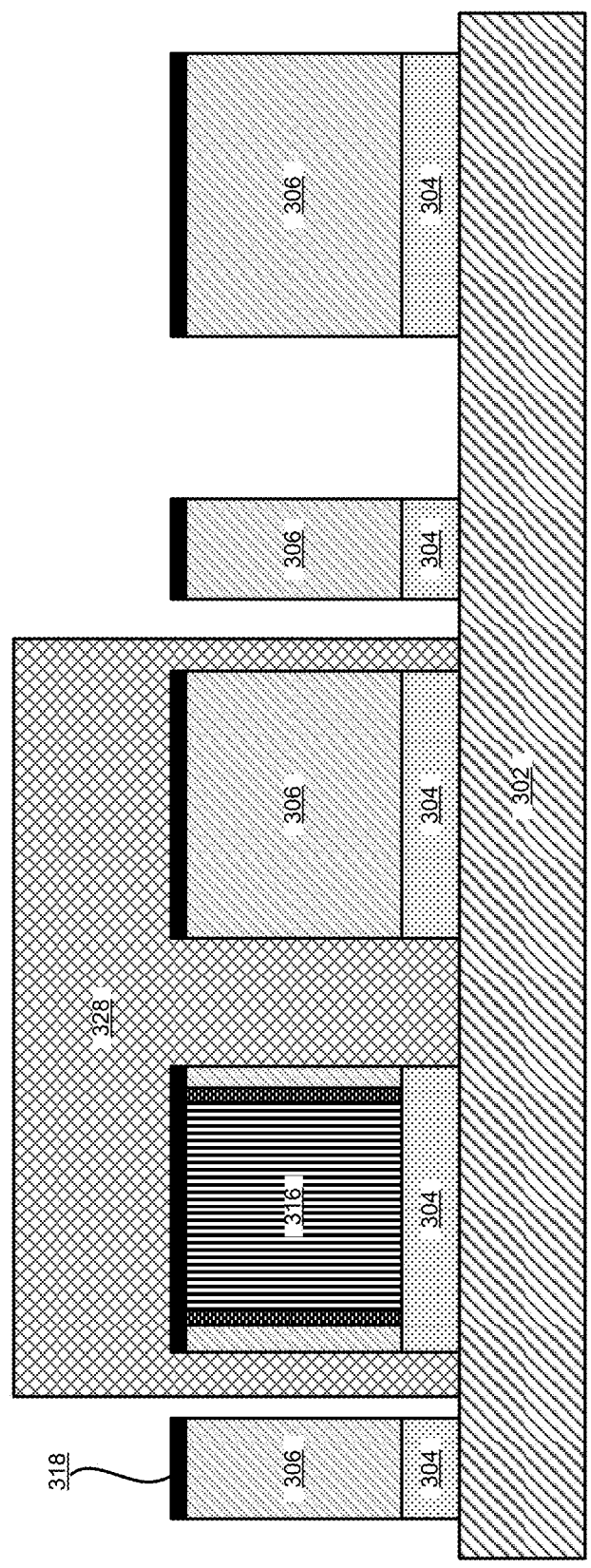
FIG. 14 depicts a cross-section view of another portion of the process according to an illustrative embodiment.

With reference to FIG. 14, FIG. 14 depicts a cross-section view of another portion of the process in which a structure 1400 is formed according to an illustrative embodiment. In the embodiment, fabrication system 107 applies a third photoresist layer 328 to optical sensor conductor region 322 and LED conductor region 324.

Figure 15:
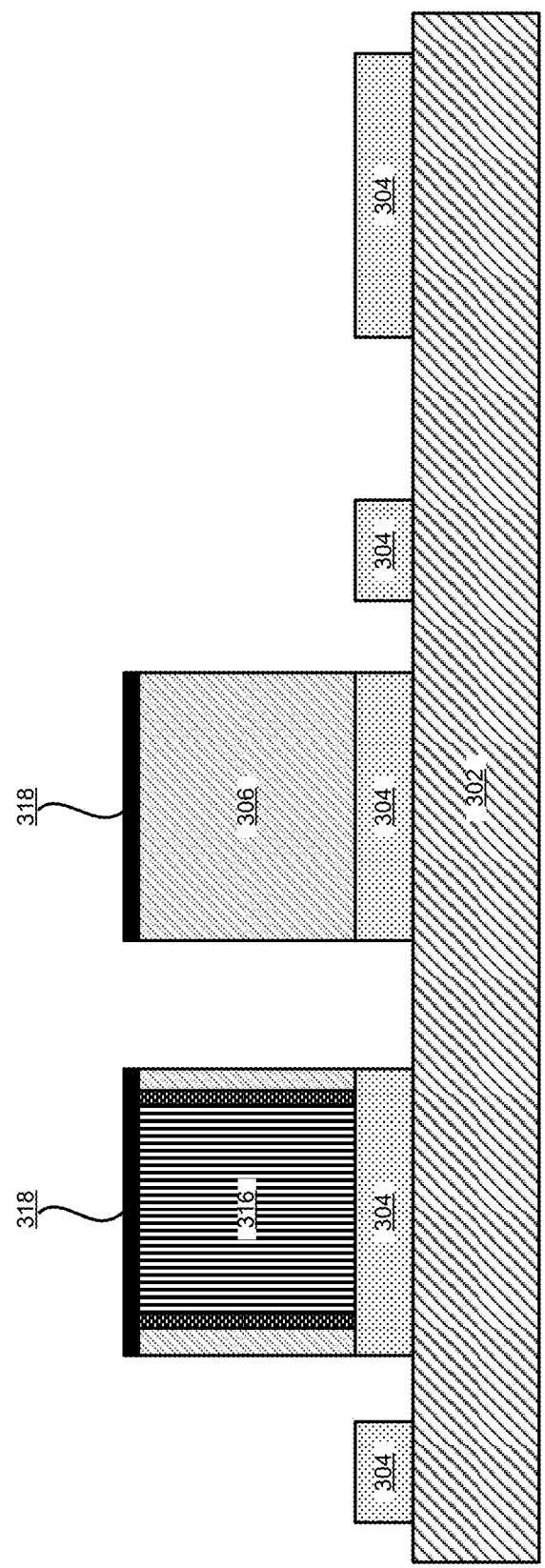
FIG. 15 depicts a cross-section view of another portion of the process according to an illustrative embodiment.

With reference to FIG. 15, FIG. 15 depicts a cross-section view of another portion of the process in which a structure 1500 is formed according to an illustrative embodiment. In the embodiment, fabrication system 107 patterns portions of ZrB2 layer 304 to open a conductor for wiring contacts to optical sensor conductor region 322 and LED conductor region 324 and for glassy carbon electrode formation. In the embodiment, fabrication system 107 further etches away contact material 318 and multilayer LED stack 306 within glassy carbon electrode conductor region 326. In a particular embodiment, fabrication system 107 etches away contact material 318 using an RIE process. In the embodiment, fabrication system 107 further strips third photoresist layer 328.

Figure 16:
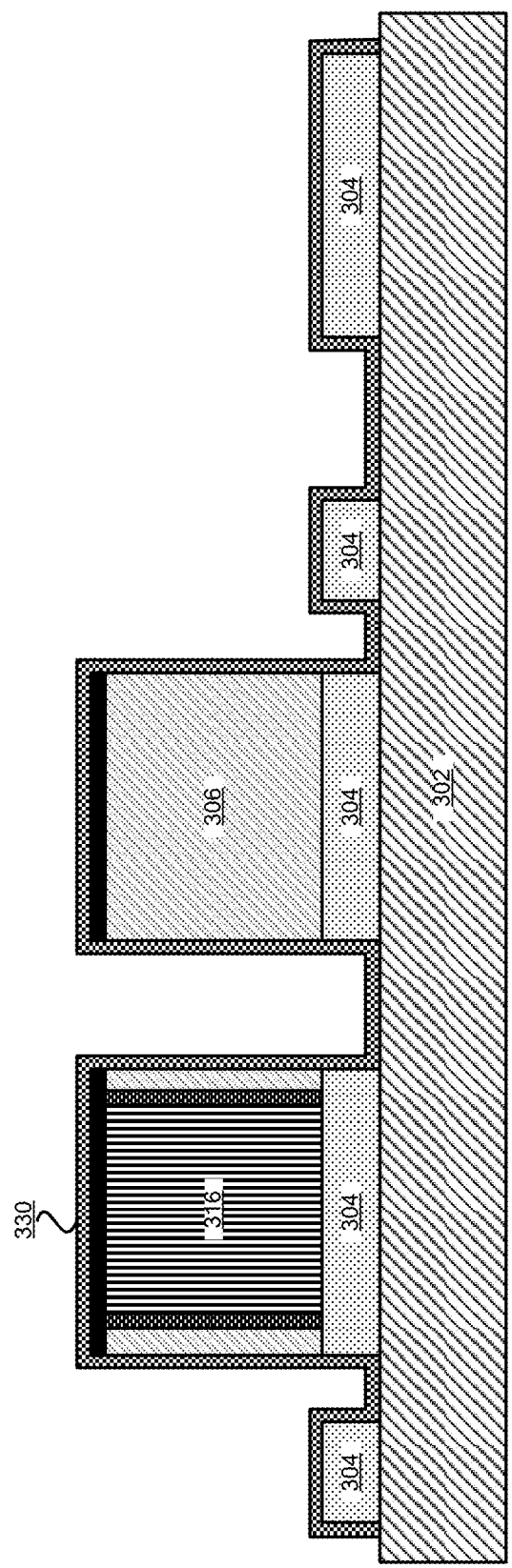
FIG. 16 depicts a cross-section view of another portion of the process according to an illustrative embodiment.

With reference to FIG. 16, FIG. 16 depicts a cross-section view of another portion of the process in which a structure 1600 is formed according to an illustrative embodiment. In the embodiment, fabrication system 107 deposits a spacer dielectric on portions of substrate 302, ZrB2 layer 304, optical sensor 316, multilayer LED stack 306, and contact material 318.

Figure 17:
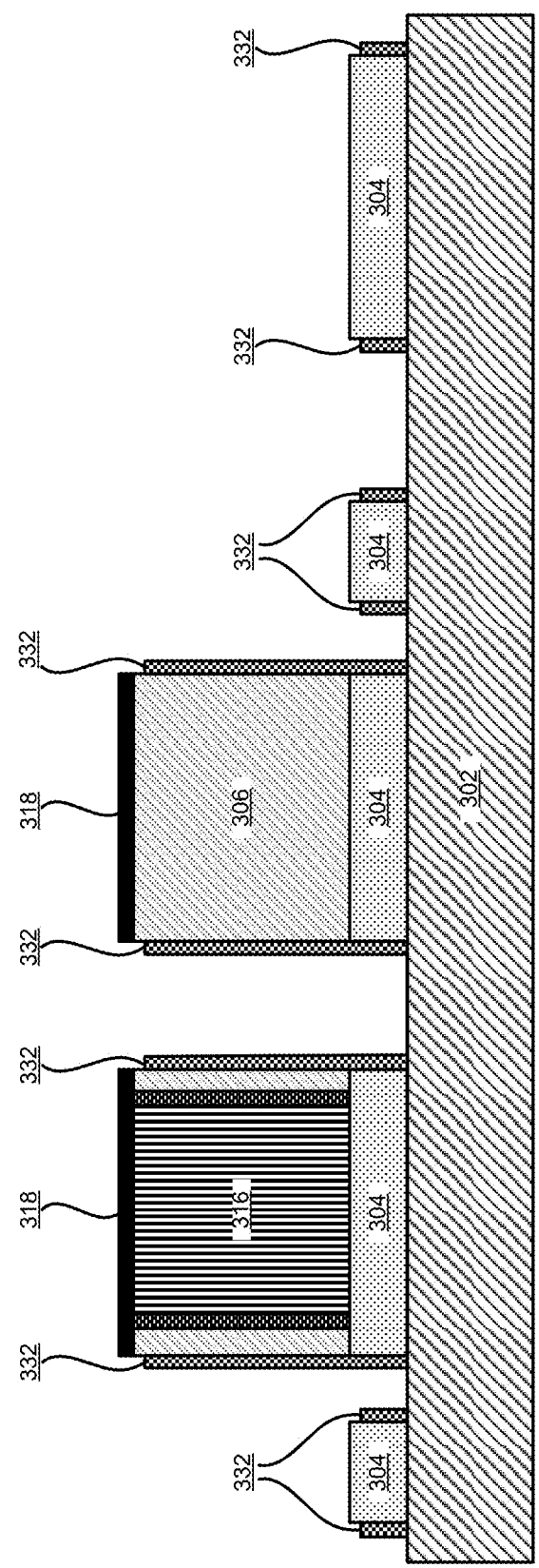
FIG. 17 depicts a cross-section view of another portion of the process according to an illustrative embodiment.

With reference to FIG. 17, FIG. 17 depicts a cross-section view of another portion of the process in which a structure 1700 is formed according to an illustrative embodiment. In the embodiment, fabrication system 107 etches spacer dielectric 330 to form dielectric outer spacers 332 proximate to remaining portions of ZrB2 layer 304, and portions of optical sensor conductor region 322 and LED conductor region 324.

Figure 18:
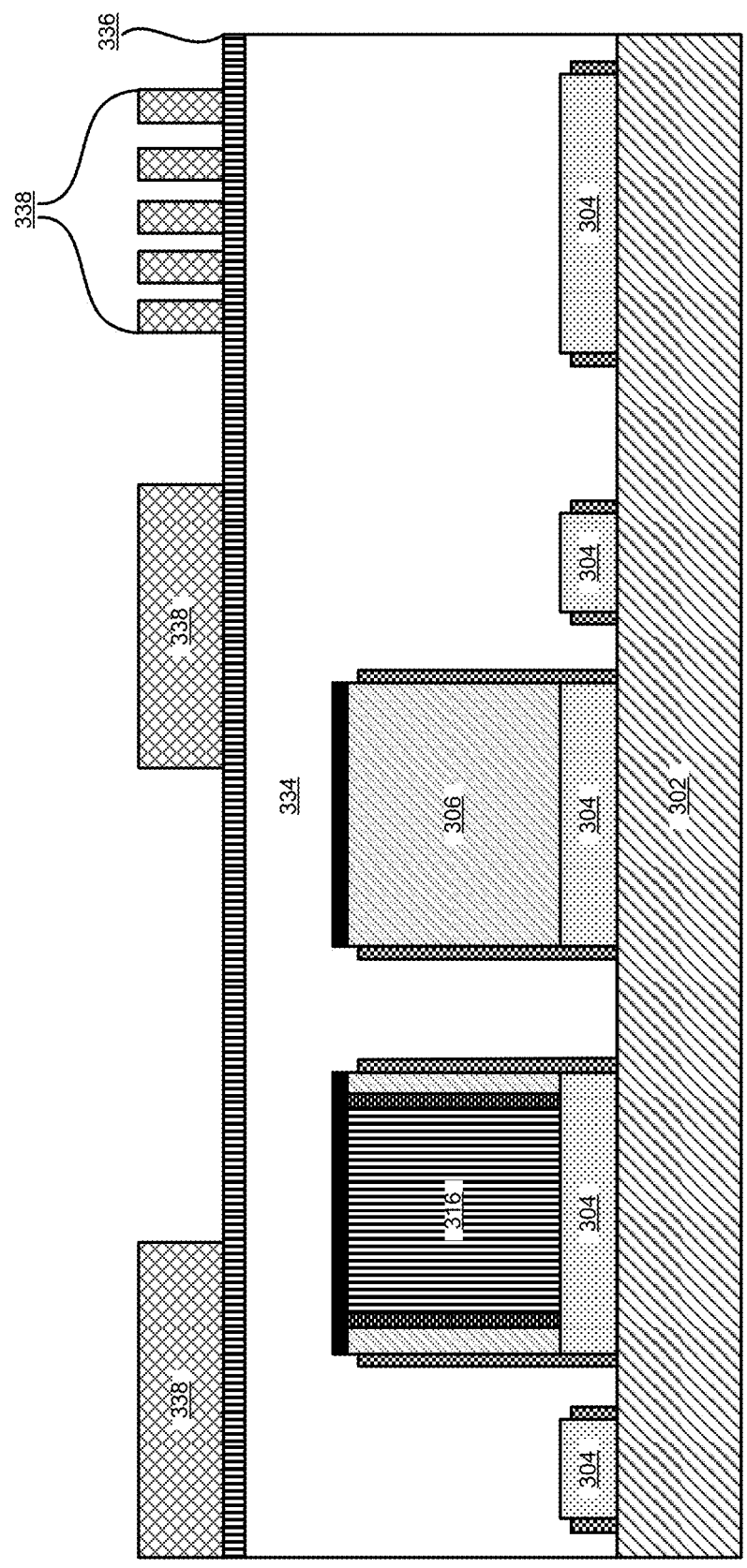
FIG. 18 depicts a cross-section view of another portion of the process according to an illustrative embodiment.

With reference to FIG. 18, FIG. 18 depicts a cross-section view of another portion of the process in which a structure 1800 is formed according to an illustrative embodiment. In the embodiment, fabrication system 107 deposits a glassy carbon material 334 in optical sensor conductor region 322, LED conductor region 324, and glassy carbon electrode conductor region 326. In a particular embodiment, fabrication system 107 deposits glassy carbon material 334 using a vapor phase chemical deposition process. In the embodiment, fabrication system 107 deposits a hard mask material 336 on glassy carbon material 334. In a particular embodiment, hard mask material 336 is composed of a titanium (Ti) material.

In the embodiment, fabrication system 107 applies a fourth photoresist layer 338 to portions of hard mask material 336. In the embodiment, fabrication system 107 further patterns glassy carbon conductor region 336. In the embodiment, fabrication system 107 strips fourth photoresist layer 338.

Figure 19:
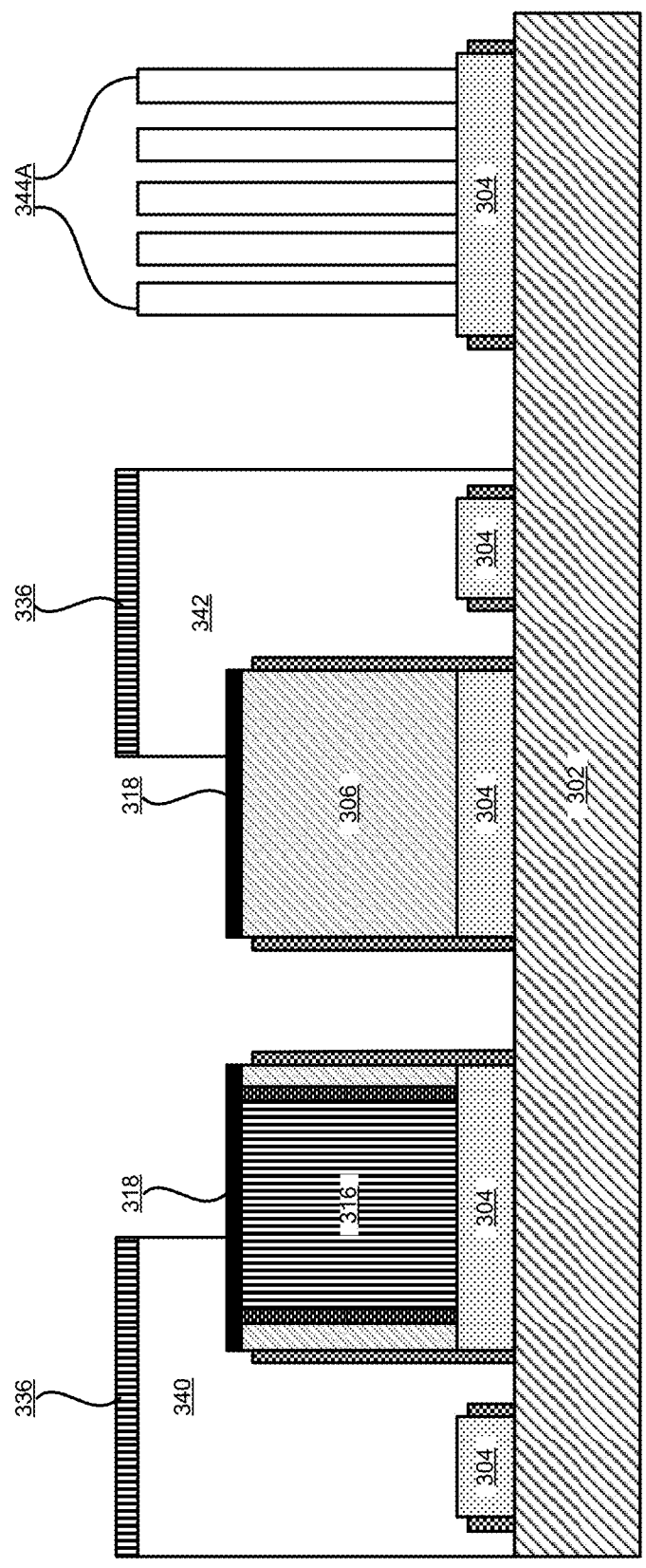
FIG. 19 depicts a cross-section view of another portion of the process according to an illustrative embodiment.

With reference to FIG. 19, FIG. 19 depicts a cross-section view of another portion of the process in which a structure 1900 is formed according to an illustrative embodiment. In the embodiment, fabrication system 107 etches hard mask material 336 and glassy carbon material 334 in glassy carbon conductor region 326 to form an optical sensor conductor 340, a multilayer LED stack conductor 342, and glassy carbon electrodes 344A disposed on a portion of ZrB2 layer 304. In a particular embodiment, fabrication system 107 etches hard mask material 336 and glassy carbon material 334 using an RIE process. In the embodiment, fabrication system 107 removes hard mask material 336 from tops of glassy carbon electrodes 344A. In a particular embodiment, fabrication system 107 removes hard mask material 336 using a dilute hydrofluoric acid (DHF) or hydrogen peroxide (H2O2).

Figure 20:
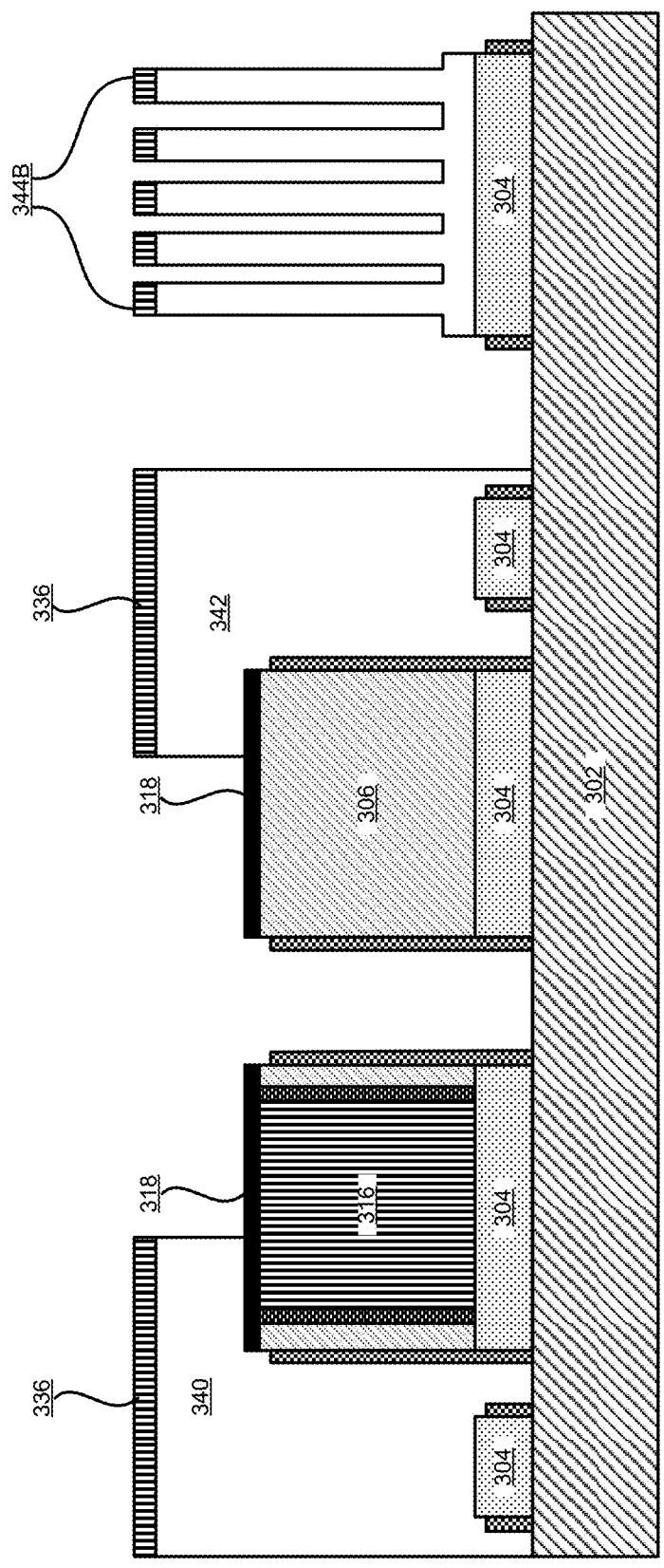
FIG. 20 depicts a cross-section view of a portion of a process according to another illustrative embodiment.

FIG. 20 depicts a cross-section view of a portion of a process according to another illustrative embodiment. In the embodiment of FIG. 20, fabrication system 107 etches hard mask material 336 and glassy carbon material 334 in glassy carbon conductor region 326 to form an optical sensor conductor 340, a multilayer LED stack conductor 342, and glassy carbon electrodes 344B in which portions of glassy carbon electrodes 344B are connected together along ZrB2 layer 304. In a particular embodiment, the portions of glassy carbon electrodes 344B are connected together due to an RIE lag effect in which portions of glassy carbon material 334 are etches away at different rates resulting in portions of glassy carbon material 334 remaining.

As a result of the process of FIGS. 3-20, a semiconductor device with integration of a light-emitting diode, a light sensor, and bio-electrode sensors on a substrate is fabricated.

Figure 21A:
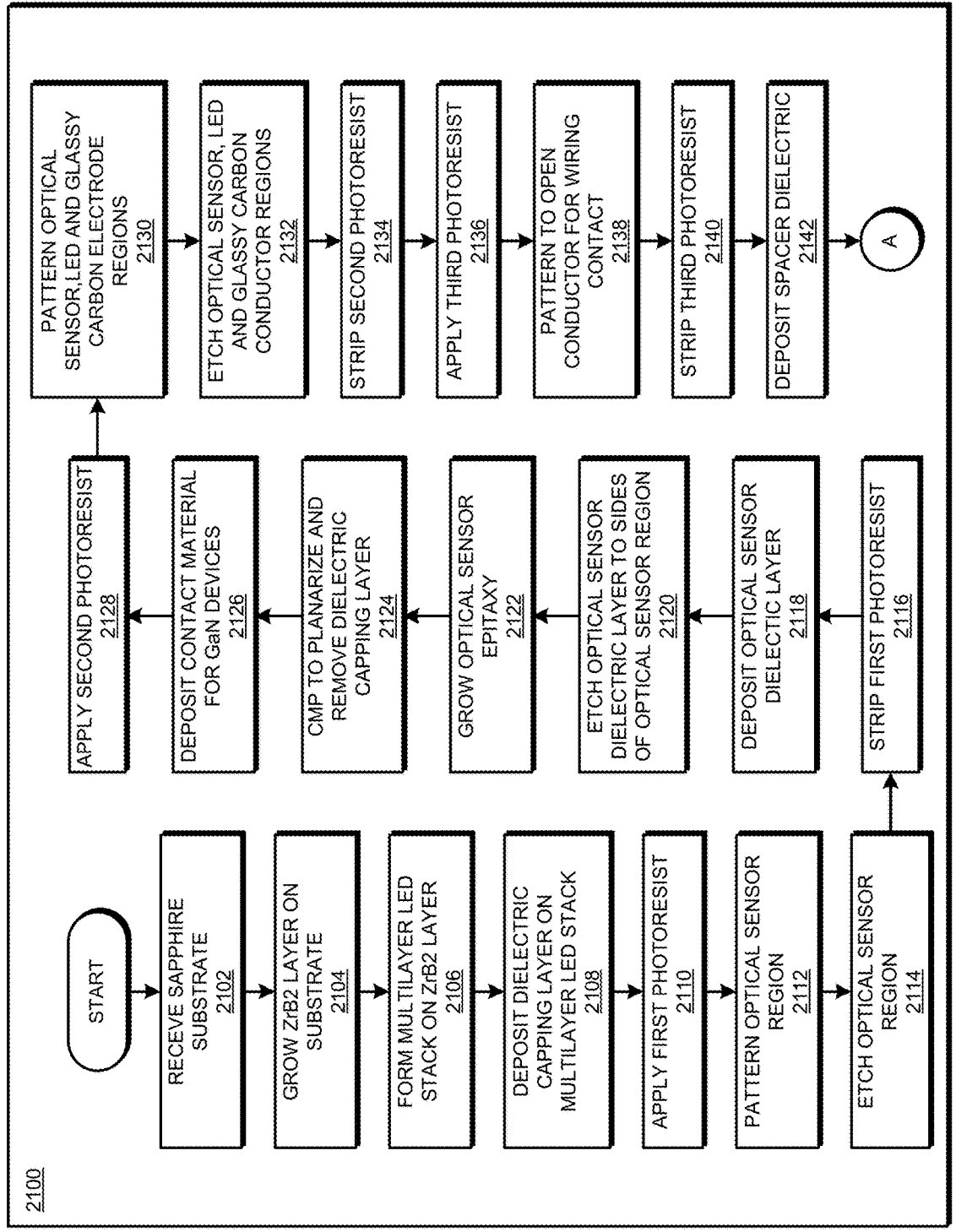
FIG. 21A depicts a portion of a flowchart of an example process for fabricating a semiconductor device with integration of a light-emitting diode, a light sensor, and bio-electrode sensors on a substrate in accordance with an illustrative embodiment.
Figure 21B:
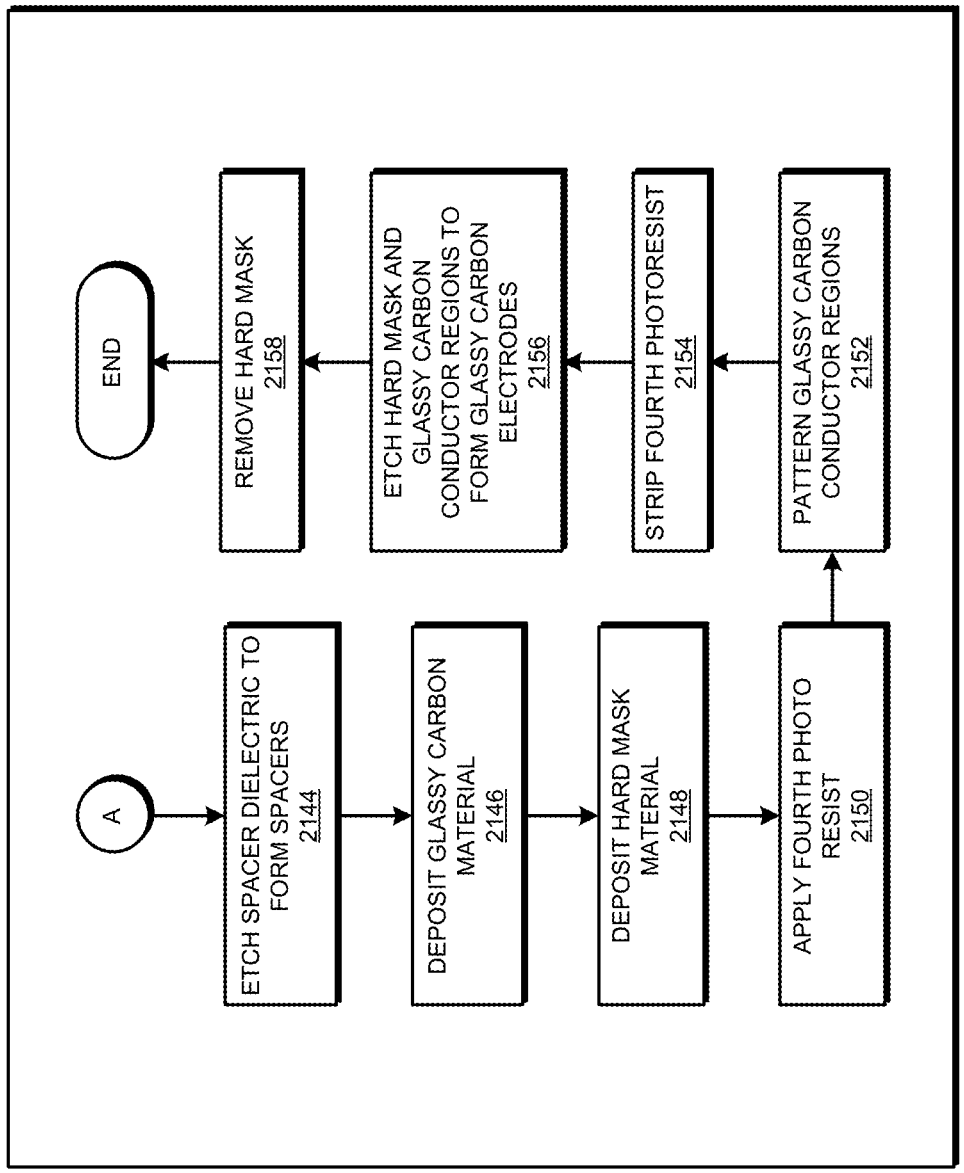
FIG. 21B depict another portion of the flowchart of an example process for fabricating a semiconductor device with integration of a light-emitting diode, a light sensor, and bio-electrode sensors on a substrate in accordance with an illustrative embodiment.

With reference to FIGS. 21A-21B, FIGS. 21A-21B depict a flowchart of an example process 2100 for fabricating a semiconductor device with integration of a light-emitting diode, a light sensor, and bio-electrode sensors on a substrate in accordance with one or more illustrative embodiments. Process 2100 can be implemented in fabrication system 107 in FIG. 1, to perform one or more steps of FIGS. 3-20 as needed in process 2100.

In block 2102, fabrication system 107 receives structure 300 including substrate 302. In one or more embodiments, substrate 302 is a sapphire ($Al_2O_3$) substrate. In block 2104, fabrication system 107 grows zirconium diboride (ZrB2) epitaxial layer 304 on substrate 302. In at least one embodiment, fabrication system 107 grows ZrB2 layer 304 on substrate 302 using an epitaxial growth process. In block 2106, fabrication system 107 forms multilayer LED stack 306 on ZrB2 layer 304. In one or more embodiments, fabrication system 107 forms each of a plurality of layers of the multilayer LED stack 306 using an epitaxial growth process.

In block 2108, fabrication system 107 deposits dielectric capping layer 308 on multilayer LED stack 306. In a particular embodiment, dielectric capping layer 308 is composed of a silicon dioxide (SiO2) or aluminum oxide (Al2O3) material. In block 2110, fabrication system 107 applies a first photoresist layer 310 to portions of dielectric capping layer 308 not including an optical sensor region of structure 500. In block 2112, fabrication system 107 patterns the optical sensor region using a lithographic patterning process.

In block 2114, fabrication system 107 etches a portion of dielectric capping layer 308 and multilayer LED stack 306 down to a depth of ZrB2 layer 304 to form optical sensor region trench 311. In a particular embodiment, fabrication system 107 etches the portion of dielectric capping layer 308 and multilayer LED stack 306 using an RIE process. In block 2116, fabrication system 107 further strips first photoresist layer 310.

In block 2118, fabrication system 107 deposits optical sensor dielectric layer 312 upon a top surface of dielectric capping layer 308 and the exposed surfaces of optical sensor region trench 311. In block 2120, fabrication system 107 etches away portions of optical sensor dielectric layer 312 to form dielectric inner spacers 314A and 314B on sides of optical sensor region trench 311. In block 2122, fabrication system 107 grows an optical sensor epitaxy in optical sensor region trench 311 to form an optical sensor 316 in contact with dielectric inner spacer 314A and 314B. In one or more embodiments, optical sensor 316 is a multilayer GaN optical sensor stack. In block 2124, fabrication system 107 removes dielectric capping layer 308 and planarizes multilayer LED stack 306 and dielectric inner spacers 314A and 314B.

In block 2126, fabrication system 107 deposits a contact material 318 for the GaN devices (i.e., the LED device and the light sensor device) on upper surfaces of multilayer LED stack 306 and dielectric inner spacers 314A and 314B. In a particular embodiment, contact material 318 is composed of a metal material such as a gold (Au) or nickel (Ni) material. In block 2128, fabrication system 107 applies a second photoresist layer 320 to contact material 318. In block 2130, fabrication system 107 patterns the optical sensor, LED, and glassy carbon electrode regions using a lithographic patterning process.

In block 2132, fabrication system 107 etches portions of multilayer LED stack 306 to form optical sensor conductor region 322, LED region 324, and glassy carbon electrode conductor region 326. In block 2134, fabrication system 107 strips second photoresist layer 320. In block 2136, fabrication system 107 applies a third photoresist layer 328 to optical sensor conductor region 322 and LED conductor region 324. In block 2138, fabrication system 107 patterns portions of ZrB2 layer 304 to open a conductor for wiring contacts to optical sensor conductor region 322 and LED conductor region 324 and for glassy carbon electrode formation. In the embodiment, fabrication system 107 further etches away contact material 318 and multilayer LED stack 306 within glassy carbon electrode conductor region 326. In block 2140, fabrication system 107 further strips third photoresist layer 328.

In block 2142, fabrication system 107 deposits a spacer dielectric on portions of substrate 302, ZrB2 layer 304, optical sensor 316, multilayer LED stack 306, and contact material 318. In block 2144, fabrication system 107 etches spacer dielectric 330 to form dielectric outer spacers 332 proximate to remaining portions of ZrB2 layer 304, and portions of optical sensor conductor region 322 and LED conductor region 324. In block 2146, fabrication system 107 deposits glassy carbon material 334 in optical sensor conductor region 322, LED conductor region 324, and glassy carbon electrode conductor region 326. In a particular embodiment, fabrication system 107 deposits glassy carbon material 334 using a vapor phase chemical deposition process.

In block 2148, fabrication system 107 deposits hard mask material 336 on glassy carbon material 334. In a particular embodiment, hard mask material 336 is composed of a titanium (Ti) material. In block 2150, fabrication system 107 applies a fourth photoresist layer 338 to portions of hard mask material 336. In block 2152, fabrication system 107 patterns glassy carbon conductor region 336. In block 2154, fabrication system 107 strips fourth photoresist layer 338.

In block 2156, fabrication system 107 etches hard mask material 336 and glassy carbon material 334 in glassy carbon conductor region 326 to form optical sensor conductor 340, multilayer LED stack conductor 342, and glassy carbon electrodes 344A disposed on a portion of ZrB2 layer 304. In a particular embodiment, fabrication system 107 etches hard mask material 336 and glassy carbon material 334 using an RIE process. In block 2158, fabrication system 107 removes hard mask material 336 from tops of glassy carbon electrodes 344A. In a particular embodiment, fabrication system 107 removes hard mask material 336 using a dilute hydrofluoric acid (DHF) or hydrogen peroxide (H2O2). Fabrication system 107 ends process 2100 thereafter. Accordingly, a semiconductor device with integration of a light-emitting diode, a light sensor, and bio-electrode sensors on a substrate is fabricated.

Thus, a computer implemented method is provided in the illustrative embodiments for fabricating a semiconductor device with integration of a light-emitting diode, a light sensor, and bio-electrode sensors on a substrate in accordance with one or more illustrative embodiments and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of fabricating a semiconductor device comprising:
   receiving a substrate;
   forming a buffer layer on the substrate;
   forming a multilayer light-emitting diode (LED) stack on the buffer layer;
   etching a portion of the multilayer LED stack to form an optical sensor region trench;
   forming a dielectric inner spacer on at least one side of the optical sensor region trench;
   growing an optical sensor epitaxy in the optical sensor region trench to form an optical sensor in contact with the dielectric inner spacer;
   depositing a contact material on the multilayer LED stack and the dielectric inner spacer;
   etching portions of the multilayer LED stack to form an optical sensor conductor region, an LED conductor region, and a glassy carbon electrode conductor region;
   depositing a glassy carbon material in the optical sensor conductor region, the LED conductor region, and the glassy carbon electrode conductor region; and etching the glassy carbon material to form an optical sensor conductor, a multilayer LED stack conductor and glassy carbon electrodes disposed on a portion of the buffer layer.

2. The method of claim 1, further comprising depositing a dielectric capping layer on the multilayer LED stack.

3. The method of claim 2, further comprising:
applying a first photoresist layer to portions of dielectric capping layer;
patterning the optical sensor using a lithographic patterning process; and
removing the first photoresist layer.

4. The method of claim 1, wherein forming the dielectric inner spacer on at least one side of the optical sensor region trench further includes:
depositing an optical sensor dielectric layer on the optical sensor region trench; and
etching away portions of the optical sensor dielectric layer to form the dielectric inner spacer.

5. The method of claim 1, further comprising:
applying a second photoresist layer to the contact material;
patterning the optical sensor conductor region, the LED conductor region, and the glassy carbon electrode conductor region; and
removing the second photoresist layer.

6. The method of claim 1, further comprising:
applying a third photoresist layer to the optical sensor region and the multilayer LED stack region;
patterning portions of the buffer layer; and
removing the third photoresist layer.

7. The method of claim 1, further comprising:
depositing a spacer dielectric on portions of the substrate, the buffer layer, the optical sensor, the multilayer LED stack, and the contact material; and
etching the spacer dielectric to form at least one dielectric outer spacer proximate to one or more remaining portions of the buffer layer, portions of the optical sensor, and the multilayer LED stack.

8. The method of claim 1, further comprising:
depositing a hard mask material on the glassy carbon material.

9. The method of claim 8, wherein the hard mask material is a titanium (Ti) material.

10. The method of claim 8, further comprising:
applying a fourth photoresist layer to portions of the hard mask material;
patterning the glassy carbon conductor region; and
removing the fourth photoresist layer.

11. The method of claim 1, wherein the substrate is a sapphire substrate.

12. The method of claim 1, wherein the buffer layer is formed of a zirconium diboride (ZrB2) material.

13. The method of claim 1, wherein the multilayer LED stack is a gallium nitride (GaN) multilayer LED stack.

14. The method of claim 1, wherein the optical sensor is a gallium nitride (GaN) optical sensor.

* * * * *